US012082375B2

(12) United States Patent
Fujimura et al.

(10) Patent No.: US 12,082,375 B2
(45) Date of Patent: Sep. 3, 2024

(54) CIRCUIT STRUCTURE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yuki Fujimura, Mie (JP); Hitoshi Takeda, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 236 days.

(21) Appl. No.: 17/778,725

(22) PCT Filed: Nov. 6, 2020

(86) PCT No.: PCT/JP2020/041500
§ 371 (c)(1),
(2) Date: May 20, 2022

(87) PCT Pub. No.: WO2021/106523
PCT Pub. Date: Jun. 3, 2021

(65) Prior Publication Data
US 2022/0418085 A1    Dec. 29, 2022

(30) Foreign Application Priority Data
Nov. 26, 2019 (JP) .................. 2019-213583

(51) Int. Cl.
*H05K 7/20* (2006.01)

(52) U.S. Cl.
CPC . *H05K 7/2039* (2013.01); *H05K 2201/10272* (2013.01)

(58) Field of Classification Search
CPC .............. H05K 1/0204; H05K 7/2039; H05K 2201/10272; B60R 16/0238; H02G 5/10
See application file for complete search history.

(56) References Cited

U.S. PATENT DOCUMENTS 8,094,461 B2 *  1/2012  Tagano ................ H05K 3/3447
                                                          361/772
10,971,914 B2 *  4/2021  Fujimura ............. H05K 1/0204
(Continued)

FOREIGN PATENT DOCUMENTS

CN    202103997    1/2012
JP    2006-074921  3/2006
(Continued)

OTHER PUBLICATIONS

International Search Report issued in International Bureau of WIPO Patent Application No. PCT/JP2020/041500, dated Jan. 12, 2021, along with an English translation thereof.

*Primary Examiner* — Adrian S Wilson
(74) *Attorney, Agent, or Firm* — GREENBLUM & BERNSTEIN, P.L.C.

(57) ABSTRACT

Provided is a circuit structure with a new structure that can improve a heat dissipation efficiency of a heat generating component while having resistance to a reaction force of a thermally conductive member. Provided is a circuit structure including: a heat generating component; bus bars that are connected to connection portions of the heat-generating component; cases that accommodate the heat-generating component and the bus bars; an elastic thermally conductive member that comes into thermal contact with the bus bars; a pressing portion that is provided on the cases and brings the bus bars into contact with the thermally conductive (Continued)

member; and a reinforcing wall portion that protrudes outside of the cases and reinforces the pressing portion.

5 Claims, 5 Drawing Sheets

(56) References Cited

U.S. PATENT DOCUMENTS

| | | | |
|---|---|---|---|
| 2006/0039127 A1* | 2/2006 | West | H05K 1/144 |
| | | | 257/691 |
| 2009/0268424 A1 | 10/2009 | Yoshida | |
| 2018/0343737 A1* | 11/2018 | Morimoto | H05K 1/0271 |
| 2019/0297720 A1 | 9/2019 | Fujimura et al. | |

FOREIGN PATENT DOCUMENTS

| | | |
|---|---|---|
| JP | 2008-147407 | 6/2008 |
| JP | 2014-079093 | 5/2014 |
| JP | 2015-194277 | 11/2015 |
| JP | 2017-152441 | 8/2017 |
| JP | 2019-169602 | 10/2019 |

* cited by examiner

CIRCUIT STRUCTURE

TECHNICAL FIELD

The present disclosure relates to a circuit structure that includes a heat generating component.

BACKGROUND ART

Conventionally, a vehicle has been equipped with a circuit structure including a heat generating component such as a relay. For example, Patent Document 1 discloses a circuit structure including a relay for interrupting the power supply of a battery to a motor or a generator connected via an inverter as a load on the vehicle side.

Since a large current flows through a heat-generating component such as a relay used in such a circuit structure, Joule heat that is proportional to the square of the amount of current is generated, and the heat generation amount is also large. In view of this, Patent Document 1 proposes a structure that dissipates heat from the relay by using an intermediate portion of a bus bar connecting a connection portion of the relay accommodated in a case and a connection terminal of a battery arranged outside of the case. Specifically, Patent Document 1 discloses a structure in which the heat generated by the relay is dissipated through thermal conduction to a chassis or a housing by coming into contact with the chassis, the housing accommodating the entire power supply device, or the like via a thermally conductive member in the intermediate portion of the bus bar extending outside of the case accommodating the relay.

CITATION LIST

Patent Documents

SUMMARY OF INVENTION

Technical Problem

In the structure of Patent Document 1, it is necessary to extend the heat dissipating portion provided on the bus bar over a long distance to another member provided outside of the case, and it is inevitable that the distance between the connection portion of the relay and the heat dissipating portion increases. For this reason, there is an inherent problem in that the heat generated by the relay cannot be dissipated efficiently. Also, since the thermally conductive member is pressed by the bus bar extending outside of the case, there has also been a risk that if the pressing force becomes large due to the dimensional tolerance of the bus bar or the like, the reaction force of the thermally conductive member will incur displacement of the bus bar or damage to other devices.

In view of this, a circuit structure having a novel structure capable of improving the heat dissipation efficiency of the heat-generating component while having durability against the reaction force of the thermally conductive member will be disclosed.

Solution to Problem

The circuit structure of the present disclosure is a circuit structure including: a heat generating component; a bus bar connected to a connection portion of the heat generating component; a case for accommodating the heat generating component and the bus bar; an elastic thermally conductive member that is configured to come into thermal contact with the bus bar; a pressing portion that is provided on the case and is for causing the bus bar to come into contact with the thermally conductive member; and a reinforcing wall portion that protrudes outside of the case and is for reinforcing the pressing portion.

Advantageous Effects of Invention

According to the present disclosure, it is possible to improve the heat dissipation efficiency of a heat-generating component while having durability against a reaction force of a thermally conductive member.

DESCRIPTION OF EMBODIMENTS

Description of Embodiments of Present Disclosure

Figure 1:
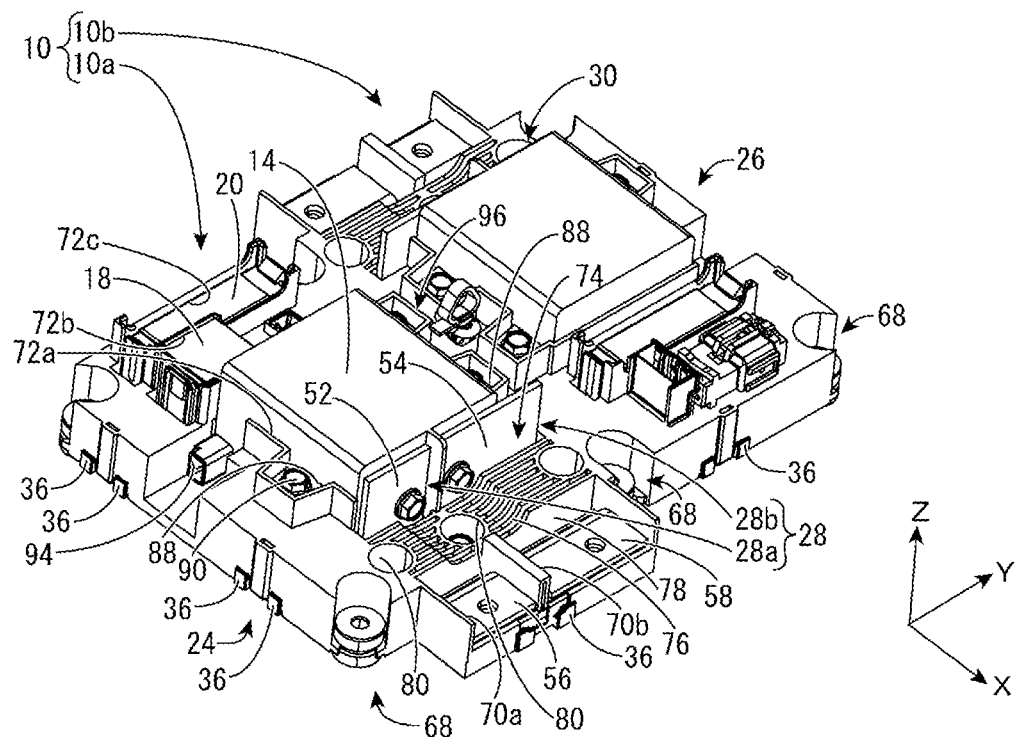
FIG. 1 is an overall perspective view showing a circuit structure according to a first embodiment of the present disclosure.

First, aspects of the present disclosure will be listed and described.

A circuit structure of the present disclosure is (1) a circuit structure including: a heat generating component; a bus bar connected to a connection portion of the heat generating component; a case for accommodating the heat generating component and the bus bar; an elastic thermally conductive member that is configured to come into thermal contact with the bus bar; a pressing portion that is provided on the case and is for causing the bus bar to come into contact with the thermally conductive member; and a reinforcing wall portion that protrudes outside of the case and is for reinforcing the pressing portion.

According to the circuit structure of the present disclosure, the bus bar connected to the connection portion of the heat generating component is in thermal contact with the thermally conductive member, and the bus bar is reliably in contact with the thermally conductive member due to the pressing portion provided on the case for accommodating the heat generating component. For this reason, it is possible to advantageously prevent the adhesion between the bus bar and the heat conductive member from decreasing and the conduction efficiency from decreasing. Also, the bus bar connected to the connection portion that serves as the heat generating portion of the heat generating component can be reliably brought into thermal contact with the thermally conductive member in the vicinity of the heat generating component without being extended to the outside of the case. As a result, the heat generated by the heat-generating component can be transferred to the case and the member outside of the case via the bus bar and the thermally conductive member, and the heat dissipation efficiency of the heat generating component can be improved.

Moreover, since the pressing portion is reinforced by the reinforcing wall portion that protrudes outside of the case, even if the pressing force with which the pressing portion presses the thermally conductive member becomes high due to the dimensional tolerance of the case, the bus bar, or the like, it is possible to prevent damage to the pressing portion that receives the reaction force, and improve the durability of the pressing portion, the case, and consequently, the circuit structure.

The pressing portion need only bring the bus bar into contact with the thermally conductive member, and does not necessarily need to press the bus bar against the thermally conductive member. However, by using a configuration in which the bus bar is pressed against the thermally conductive member, it is possible to advantageously avoid a decrease in the adhesion between the bus bar and the thermally conductive member caused by the tolerance. Also, the thermally conductive member may be placed on the wall portion of the case and brought into thermal contact with a member outside of the case via the case, or may be brought into thermal contact with the member outside of the case via an opening provided in the case. Also, the bus bar connected to the connection portion of the heat generating component includes both a bus bar used as a conductive member and a bus bar simply used for heat dissipation.

(2) It is preferable that the pressing portion is provided at a portion opposing the thermally conductive member with the bus bar of the case interposed between the pressing portion and the thermally conductive member, and the reinforcing wall portion is provided in a protruding manner on a surface opposite to a surface of the pressing portion that comes into contact with the thermally conductive member. This is because, in the pressing portion provided in the case, due to the reinforcing wall portion being provided on the surface opposite to the surface opposing the thermally conductive member, the pressing portion can be reliably reinforced by the reinforcing wall portion. Moreover, since the reinforcing wall portion is provided in a protruding manner on the surface of the pressing portion opposite to the surface that comes into contact with the thermally conductive member, a heat dissipation route can be constructed from the bus bar and the thermally conductive member via the reinforcing wall portion, and dissipation of heat from the heat generating component can be realized more advantageously.

(3) It is preferable that the reinforcing wall portion includes a plurality of reinforcing plates arranged in parallel with a gap therebetween. This is because, due to the reinforcing wall portion including a plurality of reinforcing plates arranged in parallel with a gap therebetween, each reinforcing plate functions as a heat dissipation fin, and a greater heat dissipation effect is exhibited via the reinforcing plates. Note that the reinforcing wall portion of this embodiment can be provided in any shape as long as it includes a portion in which a plurality of reinforcing plates are arranged in parallel with a gap therebetween. For example, a parallel fin shape, a grid pattern, a honeycomb structure, and the like can also be included in this aspect.

(4) It is preferable that a metal portion is embedded in the reinforcing wall portion, and a portion of the metal portion protrudes outside of the reinforcing wall portion. This is because the reinforcing effect and the heat dissipation effect of the pressing portion by the reinforcing wall portion are further improved.

(5) It is preferable to include a holding structure for holding the pressing portion in a state of being pressed against the bus bar and the thermally conductive member. This is because the bus bar and the thermally conductive member can be stably held in close contact with each other, and the desired heat dissipation can be stably maintained. For example, it is effective to bolt the pressing portion provided on the upper case to the lower case, whereby the bus bar is reliably pressed against the thermally conductive member mounted on the lower case via the pressing portion.

Details of Embodiments of Present Disclosure

Specific examples of the circuit structure according to the present disclosure will be described with reference to the drawings below. Note that the present disclosure is not limited to these examples, and is intended to include all modifications that are indicated by the claims and are within the meaning and scope of equivalents of the claims.

First Embodiment

Hereinafter, a first embodiment of the present disclosure will be described with reference to FIGS. 1 to 6. A circuit structure 10 is mounted in a vehicle (not shown) such as an electric vehicle or a hybrid vehicle. As shown in FIG. 2, for example, the circuit structure 10 is used to connect a traveling battery, which is a heat generating component, to a vehicle-side load 16 via a main relay 14. Here, the traveling battery is a battery 12, and is used as a battery for supplying electric power to a motor (not shown) for causing the vehicle to travel. Note that although the circuit structure 10 can be arranged in any orientation, description will be given hereinafter with the Z direction shown in FIG. 1 set as an upward direction, the Y direction as a width direction, and the X direction as a length direction. Note that the diagonally lower right direction in the X direction is frontward, and the opposite direction is rearward. Also, for a plurality of identical members, a reference numeral may be added to only some of the members, and the reference numeral may be omitted for other members.

Circuit Structure 10

As shown in FIG. 2, the circuit structure 10 includes a circuit structure 10a provided on the positive electrode side and a circuit structure 10b provided on the negative electrode side. The positive electrode side of the battery 12 is connected to the input side of the circuit structure 10a, and the negative electrode side of the battery 12 is connected to the input side of the circuit structure 10b. The positive electrode side of the vehicle-side load 16 is connected to the output side of the circuit structure 10a, and the negative electrode side of the vehicle-side load 16 is connected to the output side of the circuit structure 10b. Main relays 14 for connecting the battery 12 to the vehicle-side load 16 are respectively connected between the input side and the output side of the circuit structure 10a and the circuit structure 10b. In addition, pre-charge circuits 22 in which pre-charge relays 18 and pre-charge resistors 20 are respectively connected in series so as to bypass the main relays 14 are connected to the main relays 14. Note that in the first embodiment of the present disclosure, as shown in FIG. 2, the pre-charge resistor 20 is connected to the output side of the pre-charge relay 18. Also, both the main relay 14 and the pre-charge relay 18 are relays that move the contact portion to switch the contact portion on/off while current flows in the excitation coil, and control for switching on/off is performed by a control circuit (not shown). As described above, the circuit structure 10a and the circuit structure 10b have substantially the same structure.

Battery 12

In the battery 12, a plurality of chargeable secondary batteries are connected in series, and thus the output voltage is high, for example, 100 V to 400 V. It is also possible to increase the current capacity by connecting a plurality of secondary batteries in parallel. As this secondary battery, a lithium ion secondary battery, a lithium polymer secondary battery, a nickel hydrogen battery, or the like can be used. Also, a capacitor such as an electric double layer capacitor (EDLC) can be used in place of or in addition to the secondary battery. In the present specification, the secondary battery also includes a capacitor.

Vehicle-Side Load 16

The vehicle-side load 16 includes, for example, a large-capacity capacitor having a capacitance of 200 μF to 5000 μF. When the main relay 14 is switched to the on state when this capacitor is completely discharged, a large charge current flows to charge the capacitor. Since a large charge current causes damage to the contact portion of the main relay 14, the pre-charge circuit 22 is provided in order to prevent adverse effects resulting from the charge current. In the first embodiment of the present disclosure, as shown in FIG. 2, the pre-charge circuit 22 is provided in parallel with the main relay 14. The pre-charge circuit 22 connects a pre-charge resistor 20 in series with the pre-charge relay 18 in order to restrict the charge current of the capacitor of the vehicle-side load 16. The pre-charge resistor 20 restricts the charging current of the capacitor of the vehicle-side load 16 to a small value in a state where the pre-charge relay 18 and the main relay 14 are switched on.

Circuit Structure 10

Figure 2:
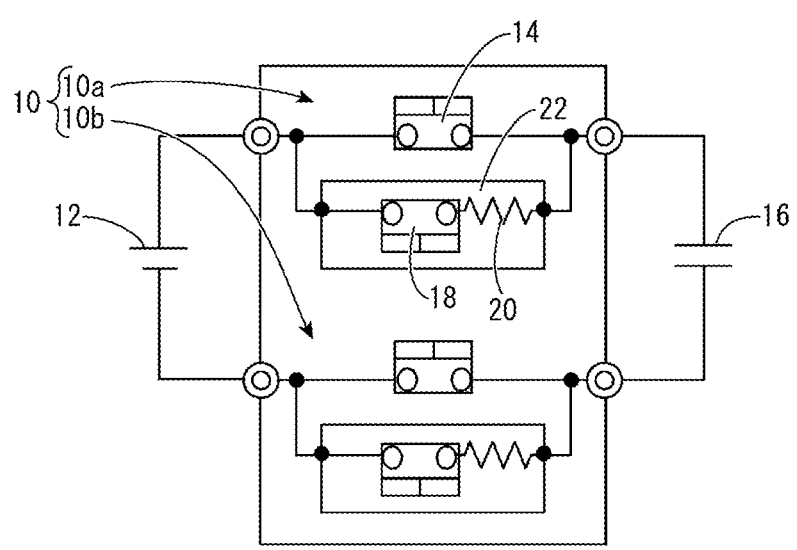
FIG. 2 is a diagram schematically showing an electrical configuration on a route from a battery to a load.
Figure 3:
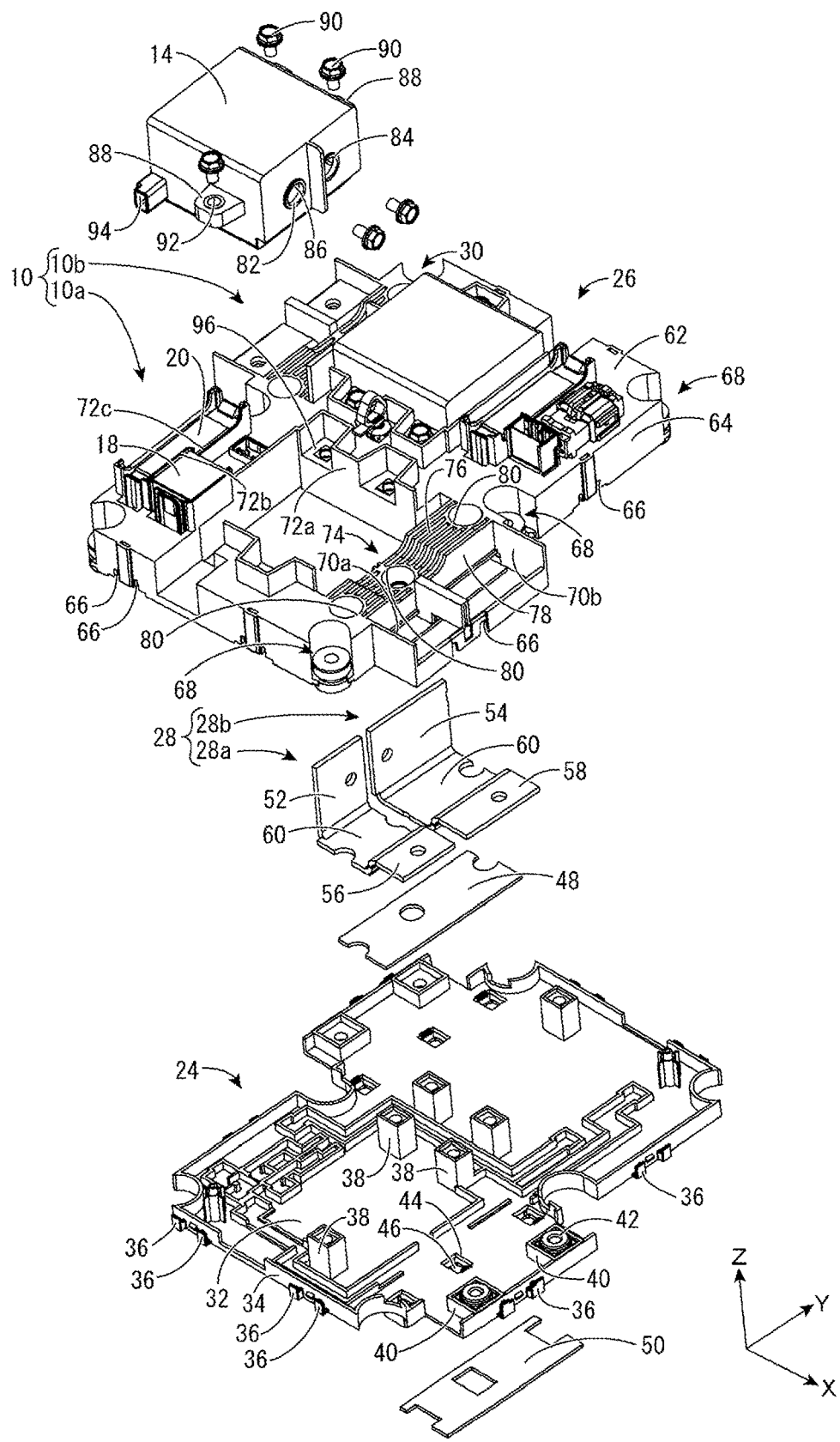
FIG. 3 is an exploded perspective view of the circuit structure shown in FIG. 1.

As shown in FIGS. 1 and 3, for example, the circuit structure 10 includes a lower case 24 located on the lower side and an upper case 26 located on the upper side when mounted in a vehicle, and a case is formed by the lower case 24 and the upper case 26. In the state where the lower case 24 and the upper case 26 are assembled, various bus bars such as a positive electrode bus bar 28 and a negative electrode bus bar 30 for connecting the battery 12 and the main relay 14 are accommodated inside the lower case 24 and the upper case 26.

Lower Case 24

Figure 4:
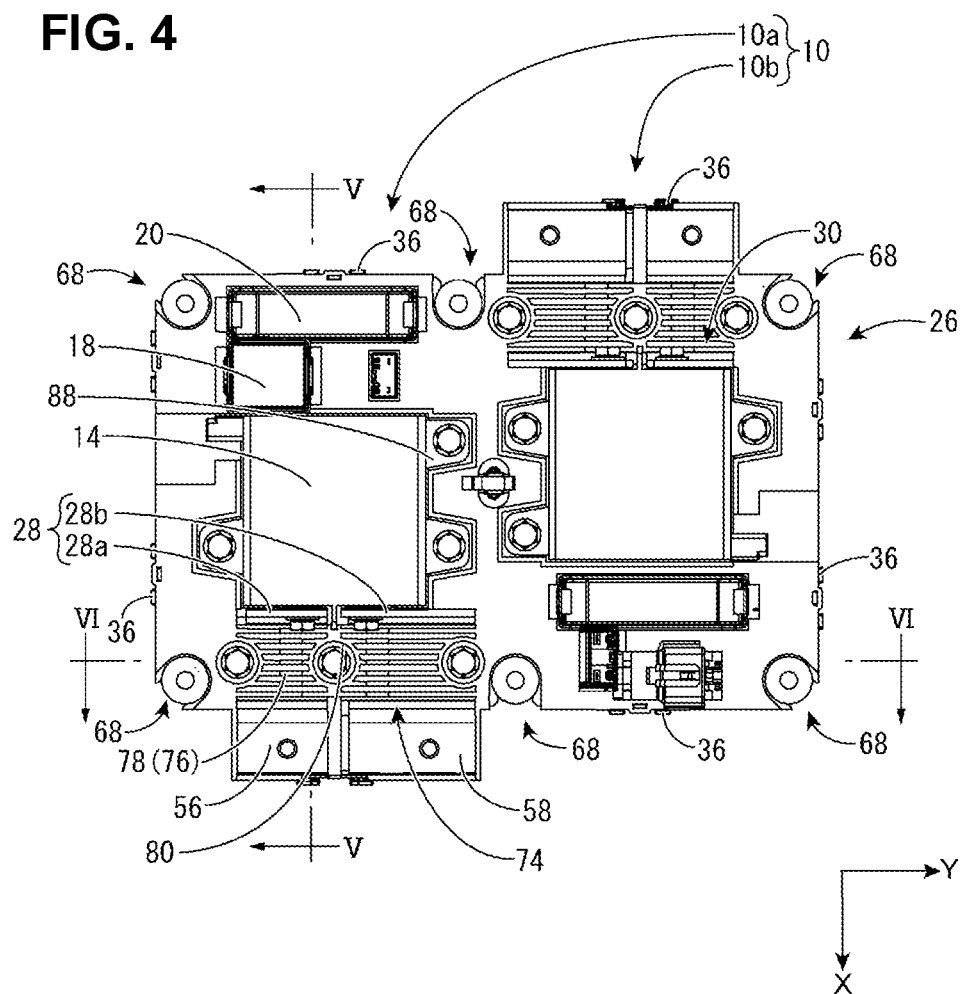
FIG. 4 is a plan view of the circuit structure shown in FIG. 1.

The lower case 24 is formed by injection-molding an insulating synthetic resin into a predetermined shape. The synthetic resin constituting the lower case 24 may also contain a filler such as glass fibers. As shown in FIG. 3, for example, the lower case 24 has a substantially rectangular box shape that opens upward as a whole, and has a bottom wall 32 and a peripheral wall 34 that is provided in a protruding manner upward from the edge portion of the bottom wall 32. As shown in FIGS. 3 and 4, on each of the four sides of the bottom wall 32 of the lower case 24, engagement portions 36 are provided in a protruding manner upward at four locations at the base end portion of the peripheral wall 34.

As shown in FIGS. 3 and 4, a circuit structure 10a provided on the positive electrode side is provided on one side in the width direction of the circuit structure 10 (on the left side in the Y direction in FIG. 4), and a circuit structure 10b provided on the negative electrode side is provided on the other side in the width direction of the circuit structure 10 (on the right side in the Y direction in FIG. 4). As described above, since the circuit structure 10a and the circuit structure 10b have approximately the same structure, the circuit structure 10a will be described here as an example. As shown in FIG. 3, main relay fixing portions 38 to which later-described leg portions 88 of the main relay 14 are bolted and that have rectangular tube shapes are provided in a protruding manner upward from three locations in the central portion in the length direction (X direction) of the bottom wall 32 of the lower case 24 in which the circuit structure 10a is formed. Annular nuts are accommodated in the main relay fixing portions 38. Also, on the front side in the length direction of the bottom wall 32 of the lower case 24 (in FIG. 3, the diagonally lower right side in the X direction), positive electrode bus bar fixing portions 40 having rectangular tube shapes are provided in a protruding manner at two locations spaced apart from each other in the width direction (Y direction), and annular nuts 42 are accommodated in the positive electrode bus bar fixing portions 40. A battery connection portion 56 of a main relay input-side bus bar 28a and a vehicle-side load connection portion 58 of a main relay output-side bus bar 28b, which will be described later, are respectively bolted to the positive electrode bus bar fixing portions 40. Furthermore, fixing portions 44 that protrude downward through the bottom wall 32 in the plate thickness direction and are for bolting the later-described pressing portion 74 of the upper case 26 to the lower case 24 are provided at three locations that are spaced apart from each other in the width direction on the bottom wall 32 between the main relay fixing portions 38 and the positive electrode bus bar fixing portions 40. Annular nuts 46 are accommodated in the fixing portions 44.

Thermally Conductive Sheets 48, 50

Figure 5:
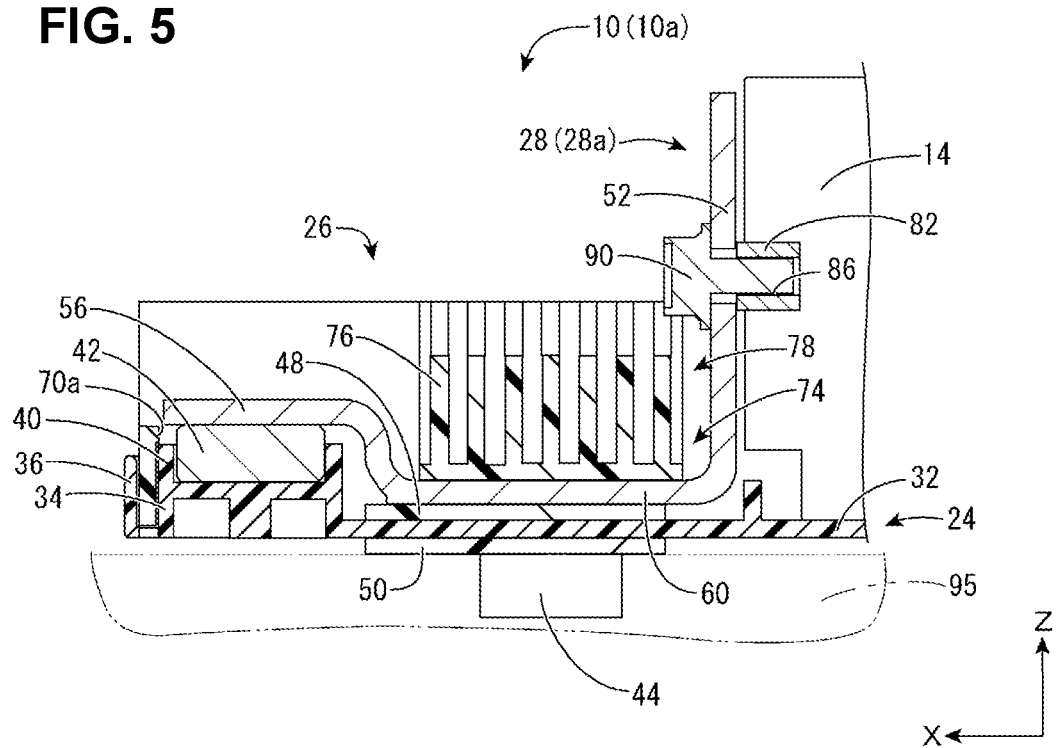
FIG. 5 is an enlarged cross-sectional view taken along V-V in FIG. 4.
Figure 6:
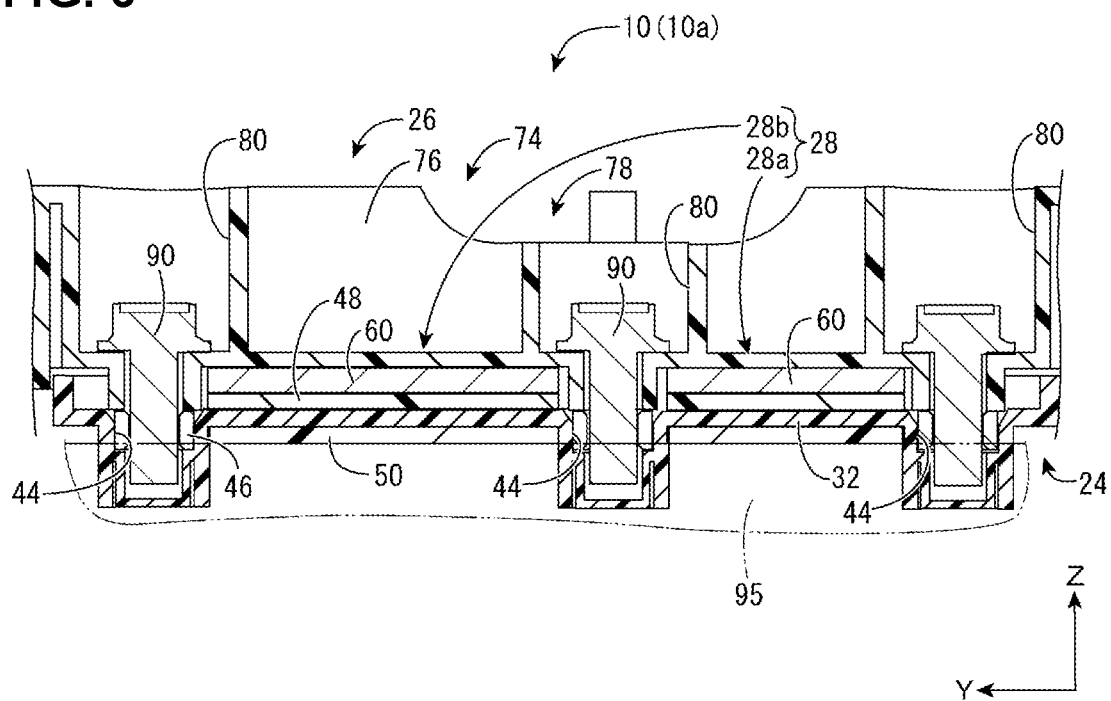
FIG. 6 is an enlarged cross-sectional view taken along VI-VI in FIG. 4.

As shown in FIGS. 3, 5, and 6, a thermally conductive sheet 48 constituting a rectangular flat plate-shaped thermally conductive member is provided on the bottom wall 32 between the fixing portions 44 of the lower case 24, and a thermally conductive sheet 50 constituting the thermally conductive member is provided on the underside surface side of the bottom wall 32 with respect to the thermally conductive sheet 48. The thermally conductive sheets 48 and 50 have sheet shapes that are flat in the vertical direction and are made of a synthetic resin having a higher thermal conductivity than air. Specifically, a silicone-based resin, a non-silicone-based acrylic resin, a ceramic-based resin, or the like can be used. More specific examples thereof include a heat dissipation gap filler, a thermally conductive grease, a thermally conductive silicone rubber, or the like made of a silicone-based resin. The thermally conductive sheets 48 and 50 are flexible and elastic, and can be elastically deformed so that the thickness dimension changes according to the force applied in the vertical direction. Note that in the present embodiment, the thermally conductive sheets 48 and 50 are adopted as the thermally conductive members, but there is no limitation thereto, and elastic thermally conductive members having any shape can be adopted.

Positive Electrode Bus Bar 28 and Negative Electrode Bus Bar 30

As shown in FIGS. 3 and 5 to 6, the positive electrode bus bar 28 and the negative electrode bus bar 30 are arranged on the bottom wall 32 of the lower case 24. Note that the positive electrode bus bar 28 and the negative electrode bus bar 30 are formed by pressing a metal plate material into a predetermined shape. As the metal constituting the positive electrode bus bar 28 and the negative electrode bus bar 30, a metal having high thermal conductivity and low electrical resistance such as copper, a copper alloy, aluminum, and an aluminum alloy can be selected as appropriate. As described above, since the circuit structure 10a and the circuit structure 10b are substantially the same structure, the positive electrode bus bar 28 of the circuit structure 10a will be described here as an example. Both the main relay input-side bus bar 28a and the main relay output-side bus bar 28b constituting the positive electrode bus bar 28 extend in the length direction (X direction in FIG. 3), have end portions on the main relay 14 side that are L-shaped, and have end portions on the other side that are bent in a crank shape. The end portions on the main relay 14 side of the main relay input-side bus bar 28a and the main relay output-side bus bar 28b are respectively a first power terminal connection portion 52 and a second power terminal connection portion 54 that are connected to a first power terminal 82 and a second power terminal 84, which form the connection portion of the main relay 14, which will be described later. The end portions on the other side of the main relay input-side bus bar 28a and the main relay output-side bus bar 28b are respectively the battery connection portion 56 and the vehicle-side load connection portion 58. The central portions in the length direction of the main relay input-side bus bar 28a and the main relay output-side bus bar 28b are both formed parallel to the bottom wall 32 of the lower case 24, and are conduction portions 60 that are arranged on the thermally conductive sheet 48 and come into thermal contact with the thermally conductive sheet 48.

Upper Case 26

The upper case 26 is formed by injection-molding an insulating synthetic resin into a predetermined shape. The synthetic resin constituting the upper case 26 may also contain a filler such as glass fibers. As shown in FIG. 3, for example, the upper case 26 has an approximate box shape that opens downward, and in which a peripheral wall 64 that protrudes downward is formed on the outer peripheral edge portion of an upper wall 62 that has a substantially horizontally elongated rectangular flat plate shape. As shown in FIGS. 3 and 4, the peripheral walls 64 on the four sides of the upper case 26 are each provided with notch-shaped engaged portions 66 at four locations spaced apart from each other in the peripheral direction of the protruding end of the peripheral wall 64. Bolt fastening portions 68 for fixing the circuit structure 10 of the present disclosure to, for example, predetermined locations of a vehicle (not shown) are provided at three locations spaced apart from each other in the width direction (Y direction) on the frontward side and the rearward side (the lower side and the upper side in the X direction in FIG. 4) of the upper wall 62 of the upper case 26. As described above, the circuit structure 10a will be described as an example for the upper case 26 as well. As shown in FIGS. 3 and 4, starting from the frontward side (the lower side in the X direction in FIG. 4), the upper surface of the upper wall 62 of the upper case 26 is provided with a battery connection portion accommodation portion 70a, a vehicle-side load connection portion accommodation portion 70b, a main relay mounting portion 72a, a pre-charge relay mounting portion 72b, and a pre-charge resistor mounting portion 72c. The battery connection portion 56, the vehicle-side load connection portion 58, the main relay 14, the pre-charge relay 18, and the pre-charge resistor 20 are mounted on these mounting portions. Also, the pressing portion 74 is provided between the battery connection portion accommodation portion 70a and vehicle-side load connection portion accommodation portion 70b, and the main relay mounting portion 72a. The pressing portion 74 has a substantially rectangular flat plate shape in a plan view, and a plurality of (seven in the present embodiment) reinforcing plates 76 that extend in the width direction (Y direction) and are arranged in parallel separated by gaps in the length direction (X direction) are formed on the upper wall 62 of the upper case 26 constituting the pressing portion 74. A reinforcing wall portion 78 is formed by including the plurality of reinforcing plates 76. As shown in FIG. 1, for example, the reinforcing wall portion 78 protrudes upward, which is the outside of the upper case 26, is exposed to the outside of the reinforcing wall portion 78, and is provided to reinforce the pressing portion 74. Also, in the pressing portion 74, bottomed cylindrical bolt fastening portions 80 that open upward are formed at three locations spaced apart from each other in the width direction (Y direction).

Main Relay 14

The main relay 14 is of a so-called mechanical type having a contact portion and a coil portion (not shown) inside. As shown in FIG. 3, for example, a first power terminal 82 and a second power terminal 84 are provided side by side in the width direction (Y direction) on the front surface of the main relay 14. Due to current being passed through the first power terminal 82 and the second power terminal 84, heat is generated at the contact portion of the main relay 14, and heat is transferred to the first power terminal 82 and the second power terminal 84. Screw holes 86 are respectively formed in the first power terminal 82 and the second power terminal 84 (see FIG. 5). As shown in FIGS. 3 and 4, leg portions 88 having approximately rectangular shapes in a view from above are provided in a manner protruding outward at three locations at the lower end portion of the main relay 14. Bolt insertion holes 92 through which bolts 90 are inserted are formed in the leg portions 88. Also, a connector accommodation portion 94 protruding outward in the width direction (Y direction) is provided at a location of the four corners of the lower end portion of the main relay 14 where the leg portions 88 are not provided. Due to an external connector (not shown) being attached to the connector accommodation portion 94, the main relay 14 can be switched on/off.

Assembly Method of the Present Embodiment

The assembly method of the present embodiment will be briefly described hereinafter. The assembly method of the present embodiment will also be described by taking the circuit structure 10a as an example, as in the description above. First, the thermally conductive sheet 48 is attached to the lower case 24 on the bottom wall 32 between the fixing portions 44, and the thermally conductive sheet 50 is attached to the underside surface side of the bottom wall 32 with respect to the heat conductive sheet 48. Subsequently, the heat transfer portions 60 are arranged on the thermally conductive sheet 48 with the main relay input-side bus bar 28a and the main relay output-side bus bar 28b constituting the positive electrode bus bar 28 arranged so as to extend in the length direction (X direction). In this state, the battery connection portion 56 of the main relay input-side bus bar 28a and the vehicle-side load connection portion 58 of the main relay output-side bus bar 28b are respectively bolted to the positive electrode bus bar fixing portions 40 of the lower case 24. Next, the upper case 26 is attached from above so as to cover the lower case 24 in this state. As a result, the engagement portions 36 of the lower case 24 are engaged with the engaged portions 66 of the upper case 26, and the engagement portions 36 and the engaged portions 66 are fixed to each other. Subsequently, the leg portions 88 of the main relay 14 are placed on the bolt fastening portions 96 provided on the peripheral edge portion of the main relay mounting portion 72a of the upper case 26. The first power terminal connection portion 52 of the main relay input-side bus bar 28a and the second power terminal connection portion 54 of the main relay output-side bus bar 28b are respectively bolted to the first power terminal 82 and the second power terminal 84 of the main relay 14, and thereafter, the leg portions 88 are fixed to the bolt fastening portions 96. As a result, the heat transfer portions 60 of the main relay input-side bus bar 28a and the main relay output-side bus bar 28b are brought into contact with the thermally conductive sheet 48 by the pressing portion 74 provided on the upper case 26, and are held in a state of being further pressed against the thermally conductive sheet 48. Furthermore, due to the engagement between the engagement portions 36 of the lower case 24 and the engaged portions 66 of the upper case 26 and the holding structure in which the bolt fastening portions 80 of the pressing portion 74 of the upper case 26 are bolted to the fixing portions 44 of the lower case 24, the pressing portion 74 is held in a state of being pressed against the heat transfer portions 60 and the thermally conductive sheet 48. As a result of the above, as shown in FIG. 5, the pressing portion 74 is provided at a portion opposing the thermally conductive sheet 48 with the heat transfer portions 60 of the upper case 26 sandwiched between them, and the reinforcing wall portion 78 is provided in a protruding manner on the upper surface, which is the surface on the side opposite to the lower surface, which is the surface that is in thermal contact with the thermally conductive sheet 48 of the pressing portion 74. Finally, the pre-charge relay 18 and the pre-charge resistor 20 are mounted on the pre-charge relay mounting portion 72b and the pre-charge resistor mounting portion 72c of the upper case 26, whereby the circuit structure 10 of the present embodiment is completed. As shown in FIGS. 5 and 6, the circuit structure 10 can be fixed to, for example, a metal bracket 95 of the vehicle using the bolt fastening portions 68 provided at six locations of the upper case 26. As a result, a new heat dissipation route is provided from the heat transfer portions 60 to the metal bracket 95 via the thermally conductive sheet 48, the lower case 24, and the thermally conductive sheet 50, and a higher heat dissipation effect can be expected. For ease of understanding, the metal bracket 95 is depicted as a virtual line. Here, description has been given taking the metal bracket 95 as an example, but there is no limitation to this, and the lower case 24 and the thermally conductive sheet 50 may be thermally connected to any member such as a battery case, instead of the metal bracket 95.

According to the circuit structure 10 of the present disclosure having such a structure, the end portions on the main relay 14 side of the main relay input-side bus bar 28a and the main relay output-side bus bar 28b constituting the bus bars in the circuit structure 10a are respectively connected to the first power terminal 82 and the second power terminal 84 that form the connection portion of the main relay 14, which is a heat generating component. Also, the central portions in the length direction (X direction) of the bus bars 28a and 28b are both heat transfer portions 60 that are in thermal contact with the thermally conductive sheet 48. Furthermore, the heat transfer portion 60 is pressed against the thermally conductive sheet 48 by the pressing portion 74 provided on the upper case 26. For this reason, the bus bars 28a and 28b connected to the first power terminal 82 and the second power terminal 84, which are heat generating portions of the main relay 14, which is a heat generating component, can be reliably brought into thermal content with the thermally conductive sheet 48 in the heat transfer portions 60 near the main relay 14. As a result, the heat generated in the main relay 14 can be quickly transferred to the outside via the lower case 24 and the upper case 26 via the bus bars 28a and 28b and the thermally conductive sheet 48, and thus the heat dissipation efficiency of the main relay 14 can be improved. Moreover, the pressing portion 74 is reinforced by the reinforcing wall portion 78 protruding to the outside of the upper case 26. For this reason, even if the pressing force with which the pressing portion 74 presses the thermally conductive sheet 48 becomes high due to the dimensional tolerances of the cases 24 and 26, the bus bars 28a and 28b, and the like, it is possible to prevent damage to the pressing portion 74 that receives the reaction force. Accordingly, it is possible to improve the durability of not only the pressing portion 74 and the cases 24 and 26 but also the circuit structure 10 itself.

In the pressing portion 74 provided on the upper case 26, the reinforcing wall portion 78 is provided on the upper surface on the side opposite to the lower surface opposing the thermally conductive sheet 48 of the upper case 26, and the pressing portion 74 is easily and reliably reinforced by this reinforcing wall portion. In addition, in the pressing portion 74, since the reinforcing wall portion 78 is provided in a protruding manner on the upper surface on the side opposite to the lower surface that is in contact with the thermally conductive sheet 48, for example, the heat dissipation path from the bus bars 28a and 28b via the reinforcing wall portion 78 can be constructed, and heat dissipation of the main relay 14, which is a heat generating component, can be realized more advantageously. Moreover, since a plurality of reinforcing plates 76 arranged in parallel with a gap therebetween are formed on the reinforcing wall portion 78, each reinforcing plate 76 functions as a heat dissipation fin, and a greater heat dissipation effect achieved via the reinforcing wall portion 78 is exhibited. Furthermore, the pressing portion 74 is held in a state of being pressed against the heat transfer portion 60 and the thermally conductive sheet 48 by the holding structure in which the bolt fastening portion 80 of the pressing portion 74 of the upper case 26 is bolted to the fixing portion 44 of the lower case 24. This makes it possible to stably maintain the desired heat dissipation.

Other Embodiments

The technique disclosed in the present specification is not limited to the embodiment described based on the description above and the drawings, and embodiments such as those described below are also included in the technical scope of the technique disclosed in the present specification.

(1) In the above-described embodiment, the thermally conductive sheets 48 and 50 were attached to both the upper and lower sides of the lower case 24, but there is no limitation to this, and the lower case 24 may be brought into direct contact with the metal bracket 95 without using the thermally conductive sheet 50. Also, the bus bar 28 may be brought into thermal contact with a thermally conductive sheet attached to any member such as a battery case outside of the circuit structure 10 through an opening provided in the lower case 24 without going through the lower case 24. Also, a heat dissipation gap filler, thermally conductive grease, or the like may be used as the thermally conductive member instead of or in addition to the thermally conductive sheets 48 and 50.

(2) In the above-described embodiment, for example, the bus bars 28a and 28b were used as conductive members, but there is no limitation to this, and bus bars that are simply used for heat dissipation may also be used, as long as they are connected to the connection portion of the heat generating component.

(3) In the above-described embodiment, a plurality of reinforcing plates 76 that extend in the width direction (Y direction) and are arranged in parallel with a gap therebetween in the length direction (X direction) were formed on the reinforcing wall portion 78, but there is no limitation to this. For example, a grid pattern, a honeycomb structure, or the like obtained by adding a reinforcing plate extending in the length direction (X direction) to this structure can also be adopted, and the reinforcing wall portion 78 can have any shape.

Figure 7:
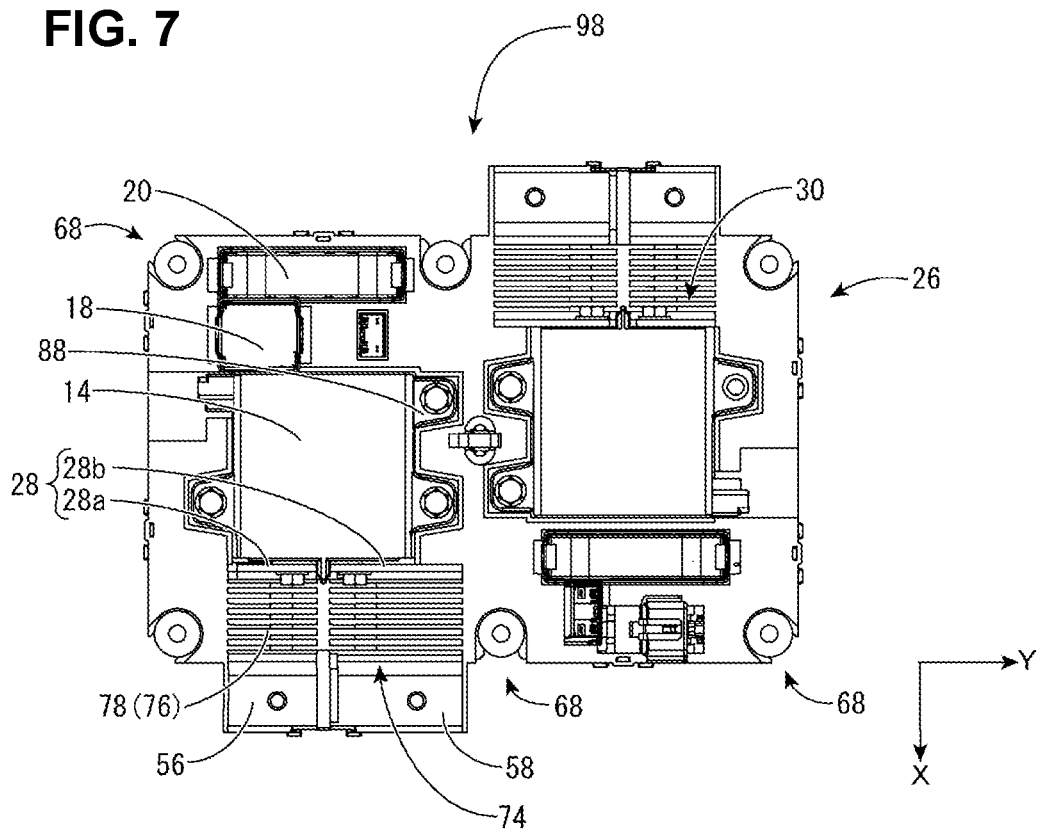
FIG. 7 is a plan view showing a circuit structure according to a second embodiment of the present disclosure, and is a diagram corresponding to FIG. 4.

(4) In the circuit structure 10 of the present disclosure, the pressing portion 74 was held in the state of being pressed against the heat transfer portion 60 and the thermally conductive sheet 48 due to the engagement between the engagement portion 36 of the lower case 24 and the engaged portion 66 of the upper case 26, and the holding structure in which the bolt fastening portion 80 of the pressing portion 74 of the upper case 26 is bolted to the fixing portion 44 of the lower case 24, but there is no limitation to this. For example, unlike the circuit structure 98 of the second embodiment shown in FIG. 7, the above-described holding structure using the bolt fastening portion 80 need not be adopted, and the above-described holding structure may be realized only by the engagement structure achieved by the engagement portion 36 of the lower case 24 and the engaged portion 66 of the upper case 26. Alternatively, the above-described holding structure may be formed by a recess/protrusion fitting structure formed by an engaging protrusion (not shown) provided in a protruding manner on the lower surface of the pressing portion 74 and an engaged portion (not shown) provided on the upper surface of the lower case 24.

Furthermore, the pressing portion 74 need only ensure the contact of the bus bar 28 with the thermally conductive sheet 48, and the bus bar 28 does not necessarily need to be pressed against the thermally conductive sheet 48.

Figure 8:
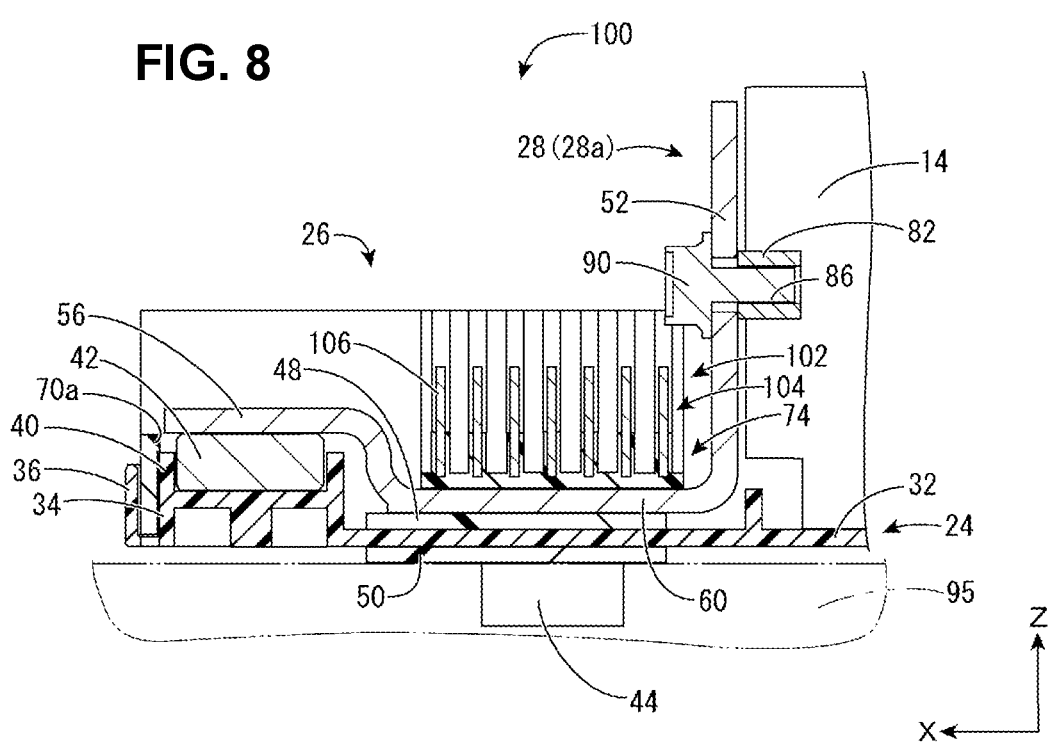
FIG. 8 is an enlarged cross-sectional view showing a circuit structure according to a third embodiment of the present disclosure, and is a diagram corresponding to FIG. 5.

(5) In the circuit structure 10 of the present disclosure, the reinforcing wall portion 78 was made of an insulating synthetic resin, but there is no limitation to this. For example, as in a circuit structure 100 of the third embodiment shown in FIG. 8, metal portions 106 may be embedded in the reinforcing wall portion 102. That is, in the circuit structure 100, the base end portions of the metal portions 106 in the form of thin flat plates are respectively embedded in the plurality of reinforcing plates 104 constituting the reinforcing wall portion 102 that reinforces the pressing portion 74 of the upper case 26. The portion other than the base end portion of each metal portion 106 protrudes to the outside of the reinforcing wall portion 102 composed of the reinforcing plates 104 in a state of protruding upward of the upper case 26 (Z direction in FIG. 8) from the upper surface of each reinforcing plate 104.

Since the metal portion 106 is embedded in each reinforcing plate 104, the reinforcing wall portion 102 composed of the plurality of reinforcing plates 104 is more firmly reinforced. Also, since the plurality of reinforcing plates 104 extend in the width direction (Y direction) of the upper case 26 and are arranged in parallel with a gap between them in the length direction (X direction) similarly to the first and second embodiments, each metal portion 106 protruding from the upper surface of each reinforcing plate 104 also similarly extends in the width direction (Y direction) of the upper case 26 and is arranged in parallel with a gap between them in the length direction (X direction). As a result, the heat dissipation performance of the heat dissipation route from the bus bars 28a and 28b via the reinforcing wall portion 102 is further advantageously improved by the metal portion 106 exhibiting the plurality of metal fin structures.

LIST OF REFERENCE NUMERALS

10 Circuit structure (first embodiment)
10a Circuit structure
10b Circuit structure
12 Battery
14 Main relay (heat generating component)
16 Vehicle-side load
18 Pre-charge relay
20 Pre-charge resistor
22 Pre-charge circuit
24 Lower case (case)
26 Upper case (case)
28 Positive electrode bus bar (bus bar)
28a Main relay input-side bus bar (bus bar)
28b Main relay output-side bus bar (bus bar)
30 Negative electrode bus bar (bus bar)
32 Bottom wall
34 Peripheral wall
36 Engagement portion
38 Main relay fixing portion
40 Positive electrode bus bar fixing portion
42 Nut
44 Fixing portion
46 Nut
48 Thermally conductive sheet (thermally conductive member)
50 Thermally conductive sheet (thermally conductive member)
52 First power terminal connection portion
54 Second power terminal connection portion
56 Battery connection portion
58 Vehicle-side load connection portion
60 Heat transfer portion
62 Upper wall
64 Peripheral wall
66 Engaged portion
68 Bolt fastening portion
70a Battery connection portion accommodation portion
70b Vehicle-side load connection portion accommodation portion 72a Main relay mounting portion
72b Pre-charge relay mounting portion
72c Pre-charge resistor mounting portion
74 Pressing portion
76 Reinforcing plate
78 Reinforcing wall portion
80 Bolt fastening portion
82 First power terminal (connection portion)
84 Second power terminal (connection portion)
86 Screw hole
88 Leg portion
90 Bolt
92 Bolt insertion hole
94 Connector accommodation portion
95 Metal bracket
96 Bolt fastening portion
98 Circuit structure (second embodiment)
100 Circuit structure (third embodiment)
102 Reinforcing wall portion
104 Reinforcing plate
106 Metal portion

The invention claimed is:

1. A circuit structure comprising:
a heat generating component;
a bus bar connected to a connection portion of the heat generating component;
a case for accommodating the heat generating component and the bus bar;
an elastic thermally conductive member that is configured to come into thermal contact with the bus bar, wherein, with respect to an upward direction of the case, the elastic thermally conductive member is positioned below both the heat generating component and the bus bar;
a pressing portion that is provided on the case and causes the bus bar to come into contact with the thermally conductive member; and
a reinforcing wall portion that protrudes outside of the case and reinforces the pressing portion.

2. The circuit structure according to claim 1,
wherein the pressing portion is provided at a portion opposing the thermally conductive member with the bus bar interposed between the pressing portion and the thermally conductive member, and
the reinforcing wall portion is provided in a protruding manner on a surface opposite to a surface of the pressing portion that comes into contact with the thermally conductive member.

3. The circuit structure according to claim 1,
wherein the reinforcing wall portion includes a plurality of reinforcing plates arranged in parallel with a gap therebetween.

4. The circuit structure according to claim 1,
wherein a metal portion is embedded in the reinforcing wall portion, and a portion of the metal portion protrudes outside of the reinforcing wall portion.

5. The circuit structure according to claim 1, further comprising
a holding structure for holding the pressing portion pressed against the bus bar and the thermally conductive member.

\* \* \* \* \*